US010170616B2

(12) United States Patent
Xie et al.

(10) Patent No.: US 10,170,616 B2
(45) Date of Patent: Jan. 1, 2019

(54) METHODS OF FORMING A VERTICAL TRANSISTOR DEVICE

(71) Applicant: GLOBALFOUNDRIES Inc., Grand Cayman (KY)

(72) Inventors: Ruilong Xie, Niskayuna, NY (US); Steven J. Bentley, Menands, NY (US); Jody A. Fronheiser, Delmar, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/268,796

(22) Filed: Sep. 19, 2016

(65) Prior Publication Data

US 2018/0083136 A1    Mar. 22, 2018

(51) Int. Cl.
*H01L 21/337* (2006.01)
*H01L 29/78* (2006.01)
(Continued)

(52) U.S. Cl.
CPC .... *H01L 29/7827* (2013.01); *H01L 21/30604* (2013.01); *H01L 29/401* (2013.01); *H01L 29/41741* (2013.01); *H01L 29/42392* (2013.01); *H01L 29/66545* (2013.01); *H01L 29/66666* (2013.01)

(58) Field of Classification Search
CPC ........... H01L 29/66666; H01L 21/0217; H01L 21/02126; H01L 21/26513; H01L 21/31051; H01L 29/6653; H01L 29/6656; H01L 29/66545; H01L 29/7827;
(Continued)

(56) References Cited

U.S. PATENT DOCUMENTS 5,342,797 A    8/1994   Sapp et al.
5,414,289 A    5/1995   Fitch et al.
(Continued)

OTHER PUBLICATIONS

Hergenrother et al., "The Vertical Replacement-Gate (VRG) MOSFET: A 50-nm Vertical MOSFET with Lithography-Independent Gate Length," IEDM 99-75, IEEE 1999.
(Continued)

*Primary Examiner* — Charles Garber
*Assistant Examiner* — Abdulfattah Mustapha
(74) *Attorney, Agent, or Firm* — Amerson Law Firm, PLLC

(57) ABSTRACT

One illustrative method disclosed herein includes, among other things, defining a cavity in a plurality of layers of material positioned above a bottom source/drain (S/D) layer of semiconductor material, wherein a portion of the bottom source/drain (S/D) layer of semiconductor material is exposed at the bottom of the cavity, and performing at least one epi deposition process to form a vertically oriented channel semiconductor structure on the bottom source/drain (S/D) layer of semiconductor material and in the cavity and a top source/drain (S/D) layer of semiconductor material above the vertically oriented channel semiconductor structure. In this example, the method further includes removing at least one of the plurality of layers of material to thereby expose an outer perimeter surface of the vertically oriented channel semiconductor structure and forming a gate structure around the vertically oriented channel semiconductor structure.

17 Claims, 6 Drawing Sheets

(51) Int. Cl.
  *H01L 21/306* (2006.01)
  *H01L 29/66* (2006.01)
  *H01L 29/417* (2006.01)
  *H01L 29/423* (2006.01)
  *H01L 29/40* (2006.01)

(58) Field of Classification Search
  CPC ... H01L 21/02; H01L 21/265; H01L 21/3105; H01L 29/66
  See application file for complete search history.

(56) References Cited

U.S. PATENT DOCUMENTS

| | | | |
|---|---|---|---|
| 6,372,559 B1 | 4/2002 | Crowder et al. | |
| 6,686,604 B2 | 2/2004 | Layman et al. | |
| 6,690,040 B2 | 2/2004 | Chaudhry et al. | |
| 6,759,730 B2 | 7/2004 | Chaudhry et al. | |
| 7,241,655 B2 | 7/2007 | Tang et al. | |
| 7,465,622 B2 | 12/2008 | Lin | |
| 7,666,733 B2 | 2/2010 | Delconibus | |
| 7,700,432 B2 | 4/2010 | Chaudhry et al. | |
| 8,637,849 B2 | 1/2014 | Deligianni et al. | |
| 9,177,785 B1 | 11/2015 | Kelly et al. | |
| 9,224,840 B2 | 12/2015 | Flachowsky et al. | |
| 9,278,362 B2 | 3/2016 | Basu et al. | |
| 9,385,195 B1 | 7/2016 | Zhang | |
| 9,660,028 B1 | 5/2017 | Cheng et al. | |
| 9,812,443 B1 | 11/2017 | Cheng et al. | |
| 2002/0119636 A1* | 8/2002 | Chittipeddi ..... H01L 21/823487 | 438/386 |
| 2003/0047749 A1 | 3/2003 | Chaudhry et al. | |
| 2003/0119237 A1 | 6/2003 | Chittipeddi et al. | |
| 2007/0111414 A1 | 5/2007 | Chaudhry et al. | |
| 2008/0054350 A1* | 3/2008 | Breitwisch ...... H01L 21/823487 | 257/330 |
| 2009/0085088 A1 | 4/2009 | Takaishi | |
| 2010/0171163 A1* | 7/2010 | Kim .................. H01L 27/11551 | 257/314 |
| 2011/0253981 A1 | 10/2011 | Rooyackers et al. | |
| 2012/0080745 A1 | 4/2012 | Lee | |
| 2013/0341270 A1 | 12/2013 | Kar et al. | |
| 2014/0353593 A1 | 12/2014 | Smets | |
| 2015/0091100 A1 | 4/2015 | Xie et al. | |
| 2015/0137271 A1 | 5/2015 | Cai et al. | |
| 2016/0005850 A1 | 1/2016 | Zhao et al. | |
| 2016/0284712 A1 | 9/2016 | Liaw | |
| 2016/0365456 A1* | 12/2016 | Liu ..................... H01L 29/7883 | |
| 2017/0229472 A1* | 8/2017 | Lu ..................... H01L 27/11582 | |
| 2017/0338334 A1 | 11/2017 | Cheng et al. | |

OTHER PUBLICATIONS

Notice of Allowance from related U.S. Appl. No. 15/097,574 dated Sep. 14, 2016.

Notice of Allowance from related U.S. Appl. No. 15/097,621 dated Sep. 19, 2016.

Notice of Allowance from related application U.S. Appl. No. 15/132,383 dated Jul. 21, 2017.

Office Action from related U.S. Appl. No. 15/445,392 dated Feb. 21, 2018.

Final Office Action from related U.S. Appl. No. 15/268,751 dated May 18, 2018.

Taiwanese Office Action dated Jun. 11, 2018, for Taiwanese patent application No. 106120888, filed on Jun. 22, 2017.

* cited by examiner

METHODS OF FORMING A VERTICAL TRANSISTOR DEVICE

BACKGROUND OF THE INVENTION

1. Field of the Invention

Generally, the present disclosure relates to the manufacture of semiconductor devices, and, more specifically, to various novel methods of forming a vertical transistor device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, vertical transistors, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned between the source/drain regions. Upon application of an appropriate control voltage to the gate electrode, a conductive channel region forms between the drain region and the source region.

FIG. 1 is a simplistic and schematic depiction of an illustrative prior art vertical transistor device 10. In general, the vertical transistor 10 comprises a generally vertically oriented channel semiconductor structure 12A that extends upward from a front surface 12S of a semiconductor substrate 12. As indicated in the upper portion of FIG. 1, the semiconductor structure 12A may have a variety of different configurations when viewed from above, e.g., circular, rectangular, square, etc., and it has an outer perimeter 12P. The device 10 further comprises a channel region 13, a gate-all-around (GAA) gate structure 14 that is positioned around the perimeter 12P of the semiconductor structure 12A, a bottom source/drain (S/D) region 16, a top S/D region 18, a bottom spacer 15B and a top spacer 15T. Also depicted is an illustrative bottom contact 20 that is conductively coupled to the bottom S/D region 16 and a top contact 22 that is conductively coupled to the top S/D region 18. In the depicted example, the gate structure 14 comprises a gate insulation layer 14A and a conductive gate electrode 14B. The materials of construction for the components of the device 10 may vary depending upon the particular application. The gate structure 14 may be manufactured using well-known gate first or replacement gate manufacturing techniques.

Device designers and manufacturers are constantly in search of device designs and methods of manufacturing that improve device performance, processing efficiencies and/or product yields. The formation of vertical transistor devices can present some special challenges. For example, it may be very difficult to control the thickness (in the vertical direction) of the top and bottom spacers and it is also very challenging to accurately control the channel length of vertical transistor devices. Yet another problem posed when manufacturing vertical transistor devices is that the top source/drain region is typically formed after the gate structure for the device is formed, which means that the thermal budget associated with the formation of the top source/drain region also impacts the previously formed gate structure, which can lead to undesirable changes and/or variations in the threshold voltage or reliability characteristics of the vertical transistor device.

The present disclosure is directed to methods of forming a vertical transistor device that may provide for improved vertical transistor devices that may be manufactured at reduced cost and may solve or at least reduce the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a vertical transistor device. One illustrative method disclosed herein includes, among other things, performing at least one etching process to define a cavity in a plurality of layers of material positioned above a bottom source/drain (S/D) layer of semiconductor material that is positioned above a semiconductor substrate, wherein a portion of the bottom source/drain (S/D) layer of semiconductor material is exposed at the bottom of the cavity, and performing at least one epi deposition process to form a vertically oriented channel semiconductor structure on the bottom source/drain (S/D) layer of semiconductor material and in the cavity and a top source/drain (S/D) layer of semiconductor material above the vertically oriented channel semiconductor structure. In this example, the method further includes, after performing the first epi deposition process, removing at least one of the plurality of layers of material to thereby expose an outer perimeter surface of the vertically oriented channel semiconductor structure and forming a gate structure around the exposed outer perimeter surface of the vertically oriented channel semiconductor structure.

One illustrative example of a novel vertical transistor device disclosed herein includes, among other things, a bottom source/drain (S/D) structure positioned above a semiconductor substrate, a vertically oriented channel semiconductor structure positioned on the bottom source/drain (S/D) structure and a bottom spacer positioned on the bottom source/drain (S/D) structure around a first vertical portion of the vertically oriented channel semiconductor structure. In this example, the device further includes a gate structure positioned above the bottom spacer and around a second vertical portion of the vertically oriented channel semiconductor structure, a top spacer positioned on the gate structure around a third vertical portion of the vertically oriented channel semiconductor structure, a top source/drain (S/D) structure positioned on the vertically oriented channel semiconductor structure, a sidewall spacer positioned on a sidewall of the top source/drain (S/D) structure and on a portion of the top spacer and a cap layer positioned above the sidewall spacer and above the top source/drain (S/D) structure.

BRIEF DESCRIPTION OF THE DRAWINGS

The disclosure may be understood by reference to the following description taken in conjunction with the accompanying drawings, in which like reference numerals identify like elements, and in which.

Figure 1:
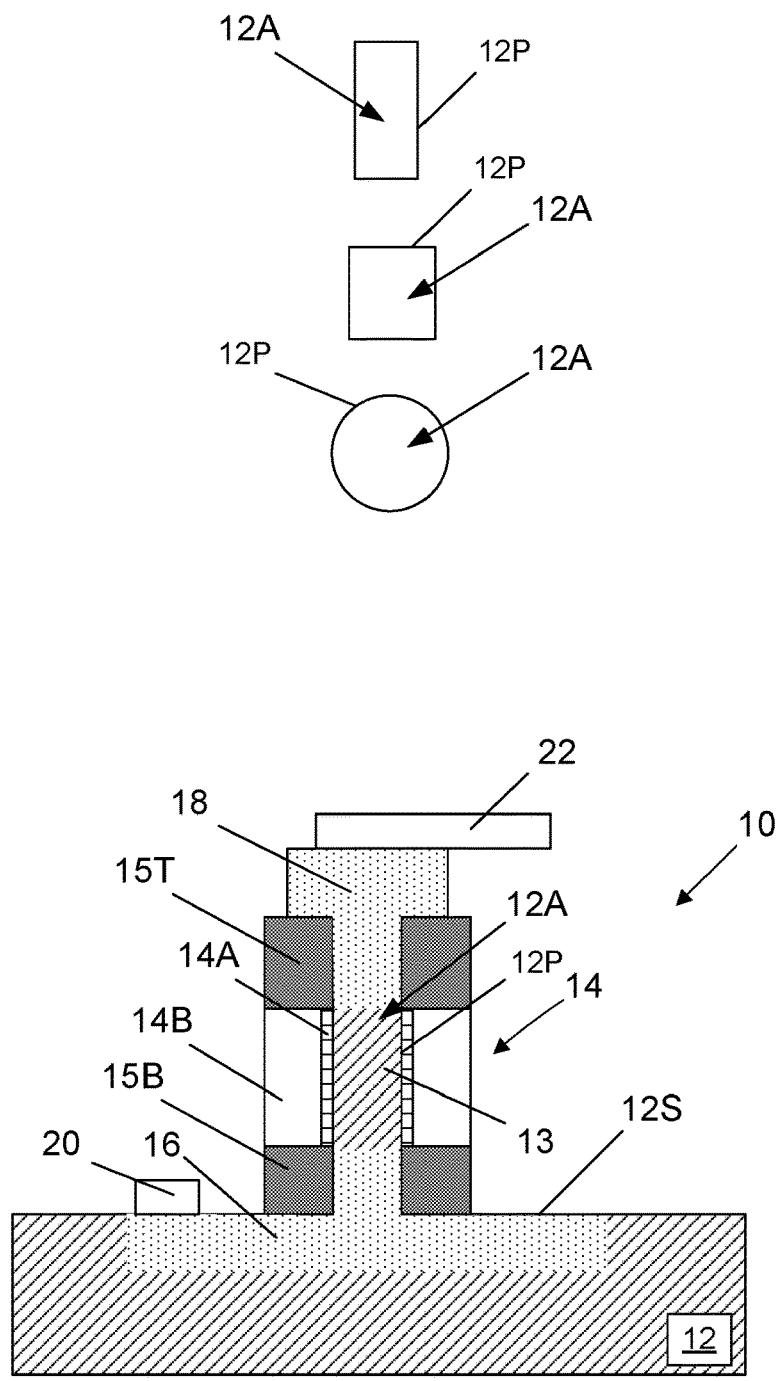
FIG. 1 simplistically depicts an illustrative prior art vertical transistor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. To the extent the term "adjacent" is used herein and in the attached claims to described a positional relationship between two components or structures, that term should be understood and construed so as to cover situations where there is actual physical contact between the two components and to cover situations where such components are positioned near one another but there is no physical contact between the two components. Physical contact between two components will be specified within the specification and claims by use of the phrase "on and in contact with" or other similar language. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the vertical transistor device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2:
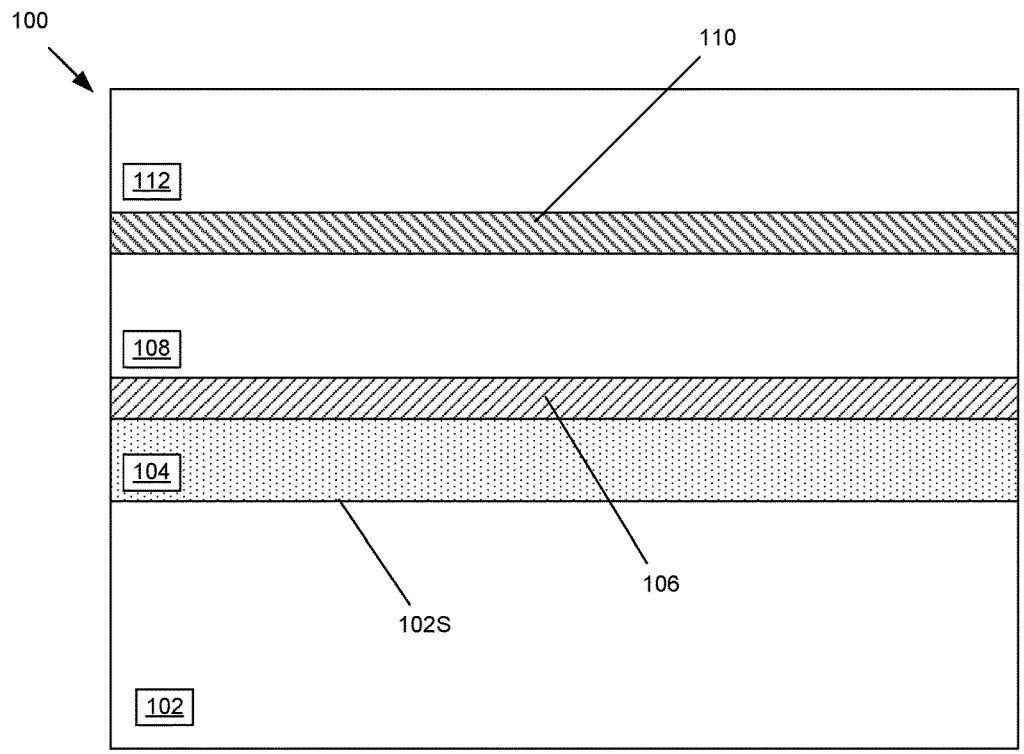
FIGS. 2-10 depict various illustrative novel methods disclosed herein for forming a vertical transistor device.

FIGS. 2-10 depict various illustrative novel methods disclosed herein for forming a vertical transistor device 100. FIG. 2 depicts one illustrative embodiment of a vertical transistor device 100 disclosed herein at an early stage of fabrication wherein several process operations have already been performed. In general, the device 100 will be formed in and above a substrate 102. The substrate 102 may have a variety of configurations, such as the depicted bulk silicon configuration. The substrate 102 may also have a semiconductor-on-insulator (SOI) or a silicon-on-insulator configuration that includes a bulk semiconductor layer (e.g., silicon), a buried insulation layer (e.g., silicon dioxide) and an active semiconductor layer (e.g., silicon), wherein semiconductor devices are formed in and above the active layer. The substrate 102 may be made of silicon or it may be made of materials other than silicon, e.g., silicon germanium, germanium, a III-V material compound, etc. Thus, the terms "substrate" or "semiconductor substrate" should be understood to cover all semiconducting materials and all forms of such materials.

With continuing reference to FIG. 2, a plurality of layers of material has been formed above the upper surface 102S of the substrate 102. More specifically, in the depicted embodiment, the layer stack comprises a bottom source/drain (S/D) layer of material 104, a bottom spacer layer of material 106, a sacrificial gate material layer 108, a top spacer layer of material 110 and a layer of material 112. The layers of material depicted in FIG. 2 may be formed to any desired thickness, they may be formed using any of a variety of techniques and they may be comprised of any desired material.

In one illustrative embodiment, the bottom source/drain (S/D) layer of material 104 comprises an epi semiconductor material that was formed by performing an epitaxial growth process. The bottom source/drain (S/D) layer of material 104 may be comprised of different materials depending upon the type of device under construction, e.g., SiGe for a P-type device, SiC for an N-type device. The bottom source/drain (S/D) layer of material 104 may be in situ doped with an appropriate dopant (N-type or P-type depending upon the type of device under construction) during the epi deposition process. In some applications, the bottom source/drain (S/D) layer of material 104 may be made of the same semiconductor material as that of the substrate 102, or it may be made of a semiconductor material that is different than that of the substrate 102.

With continuing reference to FIG. 2, the bottom spacer layer of material 106 may be formed above the bottom source/drain (S/D) layer of material 104 by performing a CVD or ALD process and it may be comprised of a material such as, for example, SiBCN, SiCO, SiOCN, etc. The sacrificial gate material layer 108 may likewise be formed above the bottom spacer layer of material 106 by performing any type of known deposition process, and it may be comprised of any of a variety of different materials, e.g., silicon dioxide, silicon oxynitride, amorphous silicon, etc. The top spacer layer of material 110 may then be deposited above the sacrificial gate material layer 108. In some applications, the bottom spacer layer of material 106 and the top spacer layer of material 110 may be comprised of the same material, although that may not be the case in all applications. Lastly, the layer of material 112 may be deposited above the top spacer layer of material 110, and it may be made of a variety of different materials such as, for example, silicon dioxide. In one illustrative embodiment, the layer of material 112 is a sacrificial layer of material.

Figure 3:
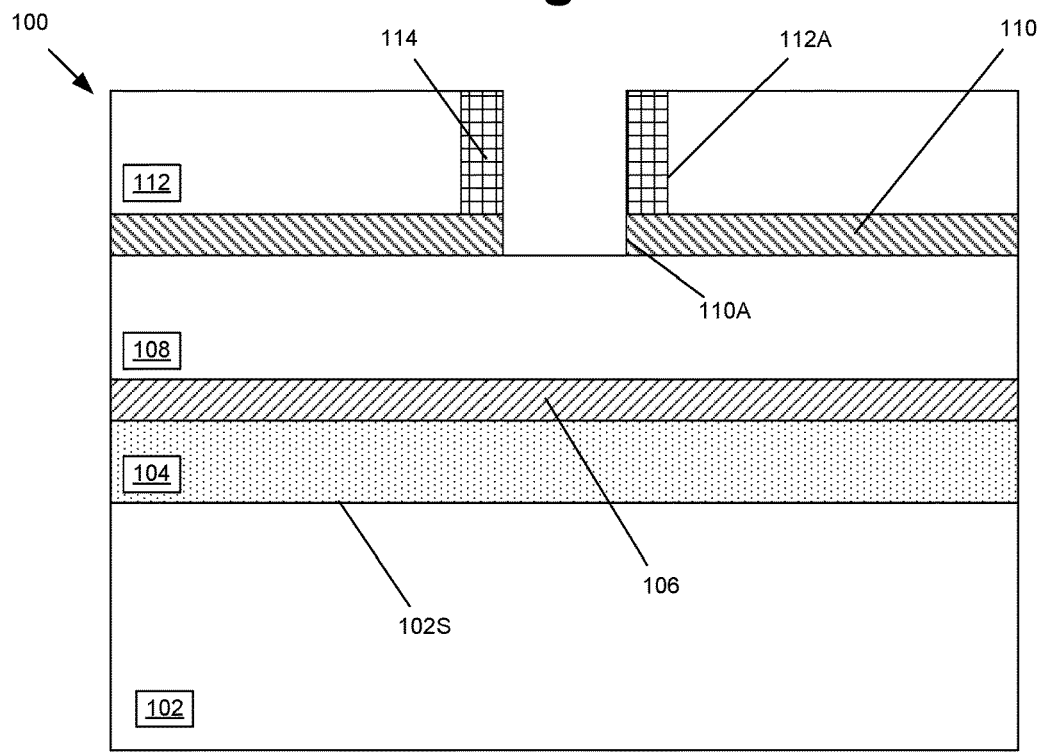

FIG. 3 depicts the device 100 after several process operations were performed. First, the layer of material 112 was patterned to define an opening 112A in the layer of material 112 using known masking and etching techniques so as to expose the top spacer layer of material 110. The opening 112A may have a variety of different configurations when viewed from above, e.g., circular, square, rectangular, etc., similar to the top-view configuration of the structure 12A shown in FIG. 1. Next, an internal spacer 114 was formed in the opening 112A by performing a conformal deposition process to form a conformal layer of spacer material (e.g., SiN) in the opening 112A and thereafter performing an anisotropic etching process. The spacer 114 may be formed to any desired lateral thickness. Then, another etching process was performed using the spacer 114 as a mask so as to define an opening 110A in the top spacer layer of material 110 and thereby expose a portion of the sacrificial gate material layer 108.

Figure 4:
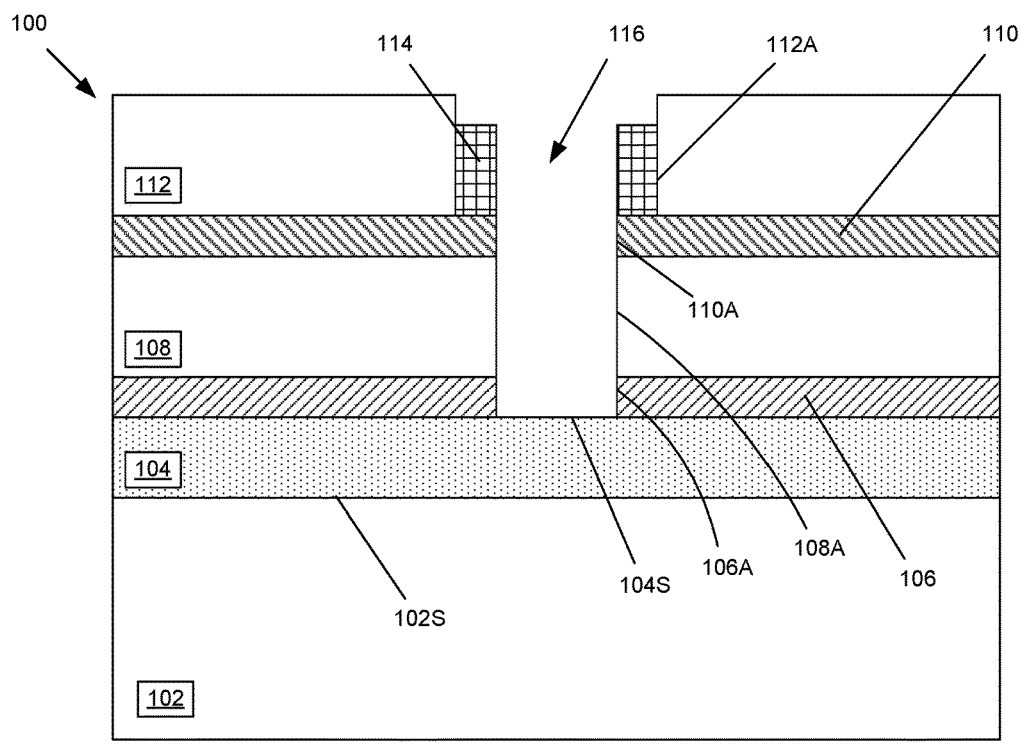

FIG. 4 depicts the device 100 after several process operations were performed. First, another etching process was performed using the now-patterned top spacer layer of material 110 as a mask so as to define an opening 108A in the sacrificial gate material layer 108 and thereby expose a portion of the bottom spacer layer of material 106. Then, yet another etching process was performed through the opening 108A to define an opening 106A in the bottom spacer layer of material 106 which exposes an upper surface 104S of the bottom source/drain (S/D) layer of material 104. Note that, during these various etching processes, some portion of the vertical height of the internal spacer 114 may be lost, as depicted in FIG. 4. As a result of these various etching processes, a cavity 116 is defined wherein a semiconductor material for a vertically oriented channel semiconductor structure 118 (see FIG. 5) will be formed for the vertical transistor device 100, as described more fully below. In the depicted example, the cavity 116 is substantially self-aligned with respect to the internal spacer 114.

Figure 5:
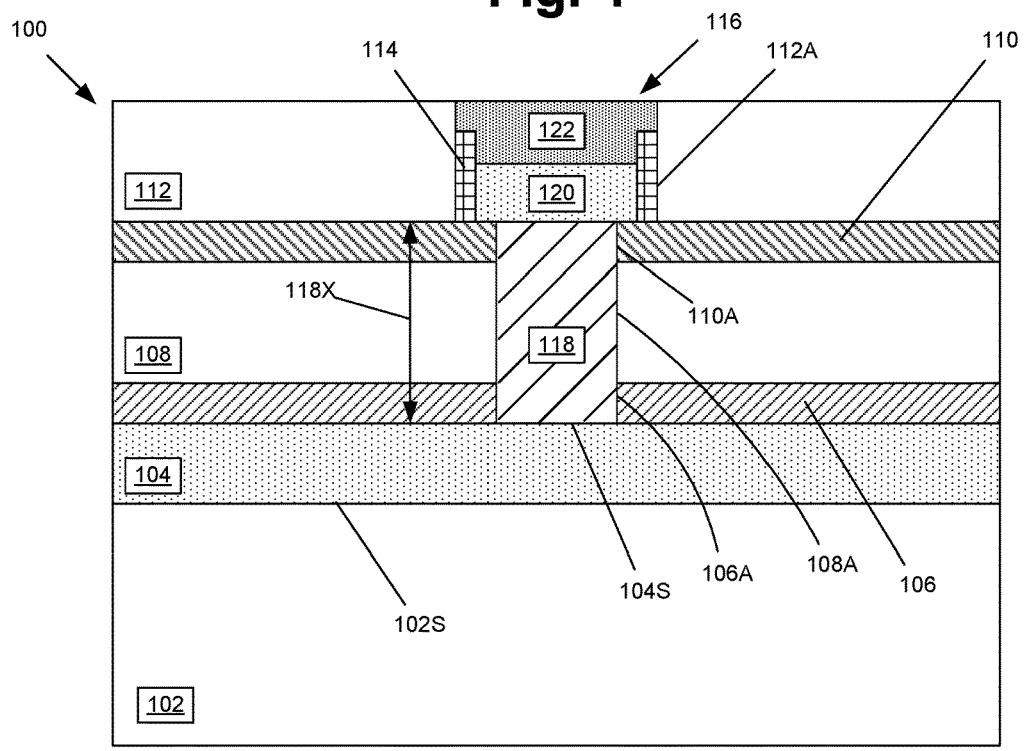

FIG. 5 depicts the device 100 after several process operations were performed. First, in one illustrative embodiment, the vertically oriented channel semiconductor structure 118 that comprises an epi semiconductor material was formed in at least a portion of the cavity 116 by performing an epitaxial growth process. The vertically oriented channel semiconductor structure 118 may be comprised of different materials depending upon the type of device under construction, e.g., SiGe for a P-type device, Si for an N-type device, and it may be made of the same material as that of the bottom source/drain (S/D) layer of material 104 or the materials may be different. The vertically oriented channel semiconductor structure 118 may have a variety of different configurations when viewed from above, e.g., circular, square, rectangular, etc., similar to the top-view configuration of the structure 12A shown in FIG. 1. In the depicted example, the vertically oriented channel semiconductor structure 118 is simplistically depicted as having a uniform lateral width throughout its entire vertical height. However, in practice, the vertically oriented channel semiconductor structure 118 may be formed in such a manner that it has a tapered cross-sectional configuration (wider at the bottom than at the top at this point in the process flow). Thus, the size and configuration of the vertically oriented channel semiconductor structure 118 should not be considered a limitation of the present invention.

With continuing reference to FIG. 5, in the depicted example, the vertically oriented channel semiconductor structure 118 has a simplistically depicted substantially planar upper surface. However, depending upon the material of the vertically oriented channel semiconductor structure 118 and the crystalline orientation of the material of the bottom source/drain (S/D) layer of material 104, the vertically oriented channel semiconductor structure 118 may have a faceted or tapered upper surface (not shown). The vertically oriented channel semiconductor structure 118 may be undoped or it may be in situ doped with an appropriate dopant material during the epi deposition process. In some applications, the vertically oriented channel semiconductor structure 118 may be made of the same semiconductor material as that of the substrate 102, or it may be made of a semiconductor material that is different than that of the substrate 102. By forming the vertically oriented channel semiconductor structure 118 by means of an epi growth process, the channel length 118X of the resulting device may be more precisely controlled as compared to cases where the channel length of the device is defined by performing an etch-back (recess etching process) on a previously formed high-k/metal gate structure (or stack) positioned around the vertically oriented channel semiconductor structure 118. In the depicted example, the epi growth process is performed until such time as the upper surface of the vertically oriented channel semiconductor structure 118 is substantially at the same height level as the upper surface of the top spacer layer of material 110. In other applications, the vertically oriented channel semiconductor structure 118 epi process may be performed for a duration such that the upper surface (or at least a portion of the upper surface) of the vertically oriented channel semiconductor structure 118 is positioned at a level that is above the height level of the upper surface of the top spacer layer of material 110. In this latter case, a chemical mechanical planarization (CMP) and/or etch-back process may be performed on the vertically oriented channel semiconductor structure 118 if desired to recess the vertically oriented channel semiconductor structure 118 to the desired height level within the cavity 116.

While still referencing FIG. 5, in one illustrative process flow, the lateral width of the internal spacer 114 is trimmed by performing a brief etching process. However, the spacer-trimming process is an optional step. Thereafter, in one illustrative embodiment, another epitaxial deposition process was performed to form a top source/drain (S/D) layer of material 120 comprising an epi semiconductor material on the upper surface of the vertically oriented channel semiconductor structure 118. In one illustrative example, the top source/drain (S/D) layer of material 120 may be deposited directly on the as-deposited upper surface of the vertically oriented channel semiconductor structure 118. In other cases, where an etch-back process is performed, the top source/drain (S/D) layer of material 120 may be deposited on the etched upper surface of the vertically oriented channel semiconductor structure 118. The top source/drain (S/D) layer of material 120 may be comprised of the same material as that of the bottom source/drain (S/D) layer of material 104 and it may doped with the same type of dopant material. In some cases, the top source/drain (S/D) layer of material 120 and the bottom source/drain (S/D) layer of material 104 may be formed so as to have the same or different thicknesses. In the depicted example, the top source/drain (S/D) layer of material 120 has a simplistically depicted substantially planar upper surface. However, depending upon the material of the top source/drain (S/D) layer of material 120 and the crystalline orientation of the material of the top source/drain (S/D) layer of material 120, the top source/drain (S/D) layer of material 120 may have a faceted upper surface (not shown). In some applications, the top source/drain (S/D) layer of material 120 may be made of the same semiconductor material as that of the substrate 102, or it may be made of a semiconductor material that is different than that of the substrate 102. In another illustrative embodiment, the top source/drain (S/D) layer of material 120 may be formed as part of the epi process that is performed to form the vertically oriented channel semiconductor structure 118, i.e., the epi process may be extended to form additional epi semiconductor material. This additional material may be doped in situ or it may be initially formed undoped and only the upper portion of the semiconductor material may be doped (by implantation) so as to effectively define the upper source/drain region 120 of the device. Lastly, a cap layer 122 was formed in the remaining un-filled portion of the opening 116. The cap layer 122 may be formed by depositing a layer of cap material, e.g., silicon nitride, and thereafter performing a CMP process to remove excess materials positioned outside of the opening 116 above the upper surface of the layer of material 112. Additionally, in this example, since the spacer 114 was trimmed, the top source/drain structure (S/D) 120 has a greater lateral width than a lateral width of the vertically oriented channel semiconductor structure 118. Also note that the spacer 114 is positioned on the sidewall of the top source/drain structure (S/D) 120 and above the top spacer layer of material 110.

Figure 6:
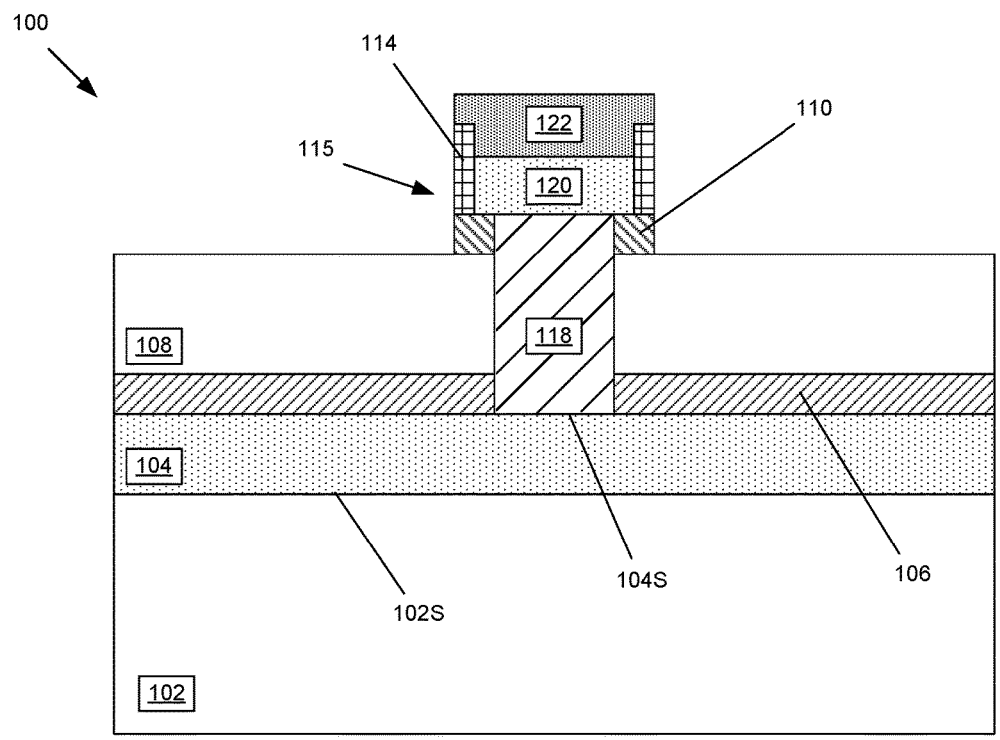

FIG. 6 depicts the device 100 after several process operations were performed. First, an etching process was performed to remove the layer of material 112 selectively relative to the surrounding materials so as to expose portions of the top spacer layer of material 110. Thereafter, the exposed portions of the top spacer layer of material 110 were removed selectively relative to the surrounding materials while the portions of the top spacer layer of material 110 that are positioned under the gate cap 122 remain in place. This etching process exposes the upper surface of the sacrificial gate material layer 108. Note that these etching processes result in the formation of a unique "L" shaped spacer 115 that is comprised of the remaining portion of the inner spacer 114 that is positioned on the sidewall of the top source/drain structure (S/D) 120 and the remaining portion of the top spacer layer of material 110 that is in contact with the spacer 114 and in contact with a portion of the bottom surface of the top source/drain structure (S/D) 120. The L-shaped spacer 115 may be comprised of at least two different materials in some applications. In other applications, the L-shaped spacer 115 may be comprised of the same material, e.g., the inner spacer 114 and the top spacer layer of material 110 may both be made of the same material.

Figure 7:
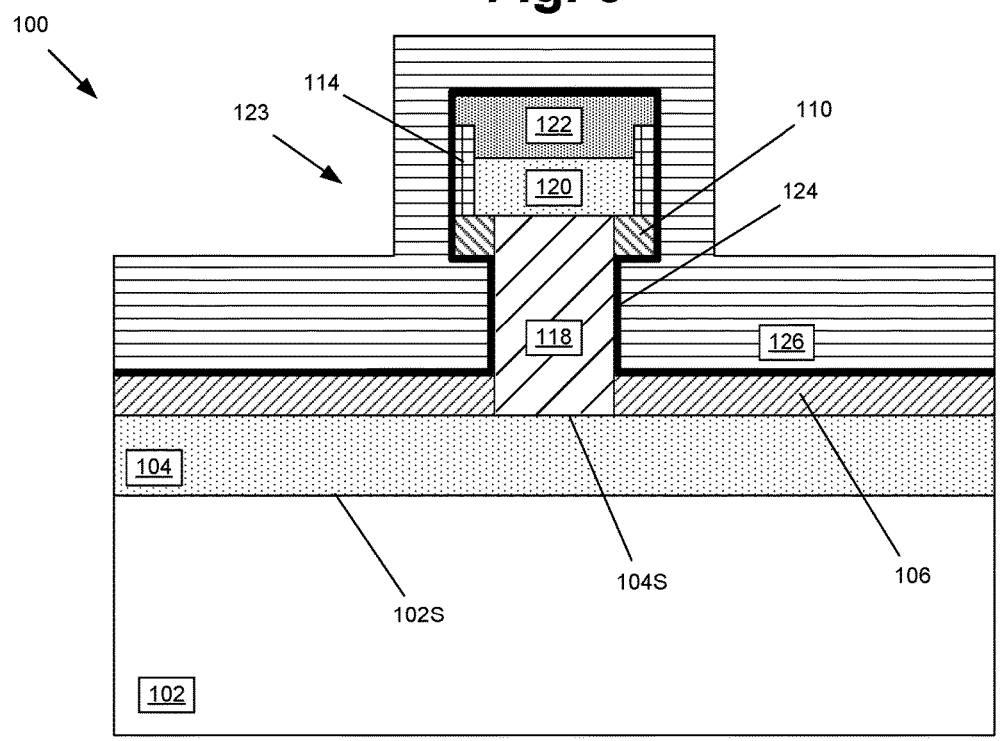

FIG. 7 depicts the device 100 after several process operations were performed. First, an etching process was performed to remove the sacrificial gate material layer 108 relative to the surrounding materials so as to expose the entire perimeter of the vertically oriented channel semiconductor structure 118 between the bottom spacer layer of material 106 and the top spacer layer of material 110. At this point, the process is directed to forming an illustrative and simplistically depicted final gate structure 123 for the vertical transistor device 100. In general, the gate structure 123 may be comprised of one or more layers of insulating material that serve (in whole or part) as the gate insulation layer 124 for the device 100, and one or more layers of conductive material, e.g., a metal, a metal alloy, polysilicon, a work-function adjusting metal, etc., that function (in whole or part) as the gate electrode 126 of the device 100. The thickness and composition of the materials for the gate structure 123 may vary depending upon the particular application, and the relative thickness of the materials for the gate structure 123 shown in the drawings is not to scale. In one illustrative example, the same materials for the gate structure 123 may be used for the gate structure for both N- and P-type devices. In other applications, by formation of appropriate masking layers (not shown), the materials for the gate structure 123 used for N- and P-type devices may be different. In one illustrative embodiment, the layer of insulating material 124 may be made of a high-k (k value of 10 or greater) insulating material, such as hafnium oxide, while the conductive gate electrode 126 may be comprised of a material such as titanium nitride (not separately shown) that functions as a work-function adjusting layer, and a bulk layer of conductive material such as a metal, a metal alloy, tungsten or a doped polysilicon. As will be appreciated by those skilled in the art after a complete reading of the present application, the gate structure 123 is intended to be representative of any type of gate structure that may be formed using any techniques. In one illustrative example, the gate insulation layer 124 and the material(s) for the gate electrode 126 may be formed by performing one or more conformal deposition processes.

Figure 8:
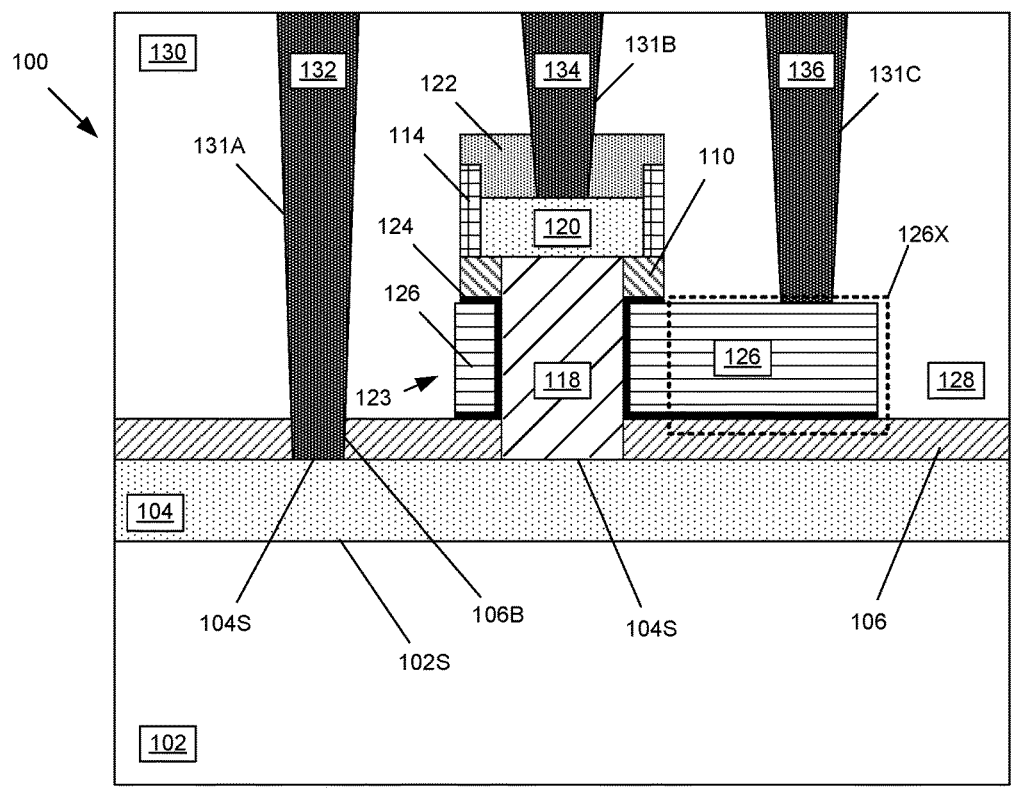

FIG. 8 depicts the device 100 after several process operations were performed. First, an etching process was performed to remove the exposed portions of the material(s) for the gate electrode 126 relative to the surrounding materials while using the gate insulation layer 124 as an etch-stop layer. Also note that, during this etching process, a gate-contact extension portion 126X (within the dashed-line region) of the gate electrode material 126 is masked with an etch mask (not shown) so as to extend the gate electrode material 126 away from the vertically oriented channel semiconductor structure 118 to thereby provide the gate-contact extension portion 126X that may be contacted by a gate contact structure (as described more fully below). Note that, when viewed from above, the gate-contact extension portion 126X does not extend around the entire perimeter of the gate structure 123 as it is provided simply to provide a means to electrically contact the gate structure 123. Normally, the gate-contact extension portion 126X may be formed such that it is positioned behind the vertically oriented channel semiconductor structure 118 in the view shown in FIG. 8. However, for explanation purposes only, and to simplify the drawings, the gate-contact extension portion 126X is depicted as extending laterally away from the side of the vertically oriented channel semiconductor structure 118. But such illustrative and simplistic depictions of the gate-contact extension portion 126X should not be considered to be any limitation of the present inventions.

With continuing reference to FIG. 8, a layer of insulating material 130 was formed above the substrate 102. Thereafter, a CMP process was performed to planarize the upper surface of the layer of insulating material 130. The layer of insulating material 130 may be made from a variety of materials, e.g., silicon dioxide, and it may be formed by performing, for example, a CVD process. The next series of process operations involves forming a so-called CA contact structure 132 so as to establish electrical contact to the bottom source/drain (S/D) structure 104, a so-called CA contact structure 134 so as to establish electrical contact to the top source/drain (S/D) structure 120 and a so-called CB gate contact structure 136 so as to establish electrical contact to the gate electrode 126 via the gate-contact extension portion 126X. In one illustrative process flow, the contact openings 131A-C may all be formed at the same time in the layer of insulating material 130 or they may be formed at different times. The layer of insulating material 130 may be patterned by forming one or more patterned etch masks (not shown), such as a patterned layer of photoresist material or OPL, above the layer of insulating material 130, and thereafter performing an etching process. Note that, when the contact opening 131A is formed, it exposes the bottom spacer layer of material 106. Thus, an etching process is performed to define an opening 106B in the bottom spacer layer of material 106 so as to expose a portion of the upper surface 104S of the bottom source/drain (S/D) structure 104. When the contact opening 131B is formed through the cap layer 122, it exposes a portion of the top source/drain (S/D) structure 120. Similarly, the formation of the contact opening 131C exposes a portion of the upper surface of the gate-contact extension portion 126X. At this point, if desired, a metal silicide material (not shown) may be formed on the exposed portions of the bottom source/drain (S/D) structure 104, the top source/drain (S/D) structure 120 and the gate-contact extension portion 126X. Thereafter, one or more conductive materials are deposited into the contact openings 131A-C and one or more CMP process operations are performed to remove excess materials outside of the contact openings 131A-C above the upper surface of the layer of insulating material 130 so as to thereby define the CA contacts 132, 134 and the CB contact 136. The contacts 132, 134 and 136 are intended to be representative in nature in that they are intended to represent any type of conductive materials that may be used in forming conductive structures on integrated circuit products, e.g., tungsten, copper, etc. Moreover, the contacts 132, 134 and 136 may comprise one or more barrier layers (not shown). At this point in the process flow, traditional metallization layers (not shown) may be formed above the device 100 so as to establish electrical contact to the contacts 132, 134 and 136.

Figure 9:
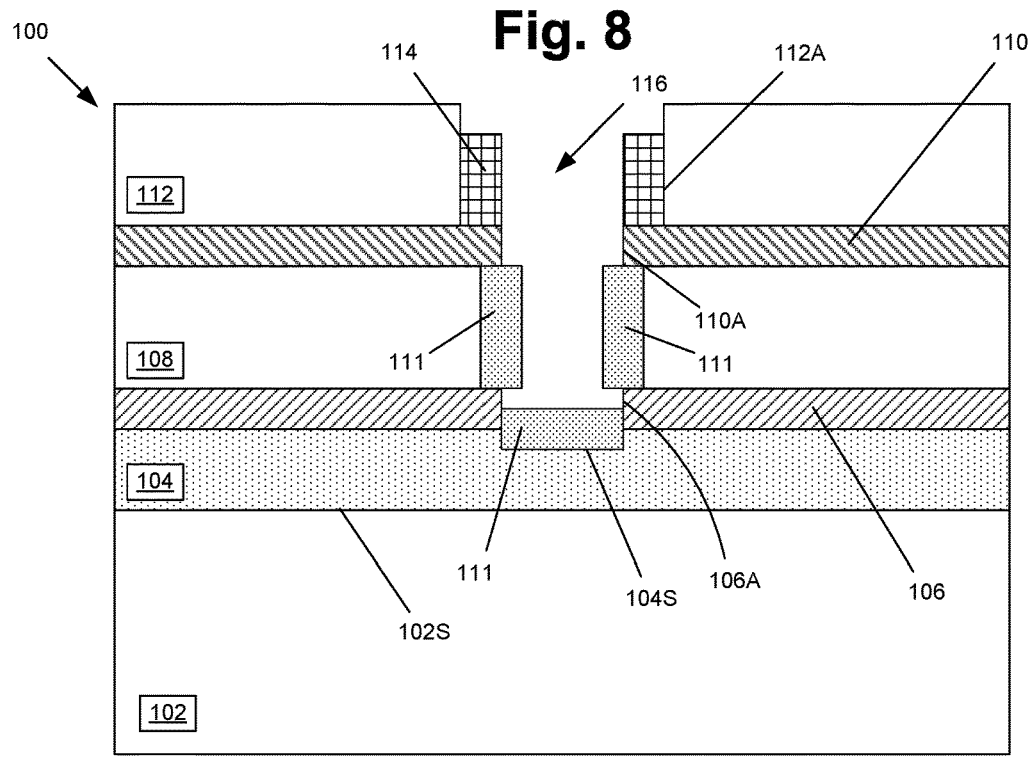

FIG. 9 depicts an alternative process flow wherein the sacrificial gate material layer 108 is made of an oxidizable material, such as amorphous silicon, polysilicon, etc. In this example, after the formation of the internal spacer 114 and the formation of the cavity 116, an oxidation process was performed to form oxide regions 111 on the exposed portions of the sacrificial gate material layer 108 and on the exposed portion of the bottom source/drain (S/D) layer of material 104. Thereafter, an etching process may be performed using the internal spacer 114 as an etch mask so as to remove portions of the oxide region 111 positioned on the sidewalls of the sacrificial gate material layer 108 while removing the oxide region 111 formed on the bottom source/ drain (S/D) layer of material 104 at the bottom of the cavity 116. At this point, the vertically oriented channel semiconductor structure 118 may be formed in the cavity as described above.

Figure 10:
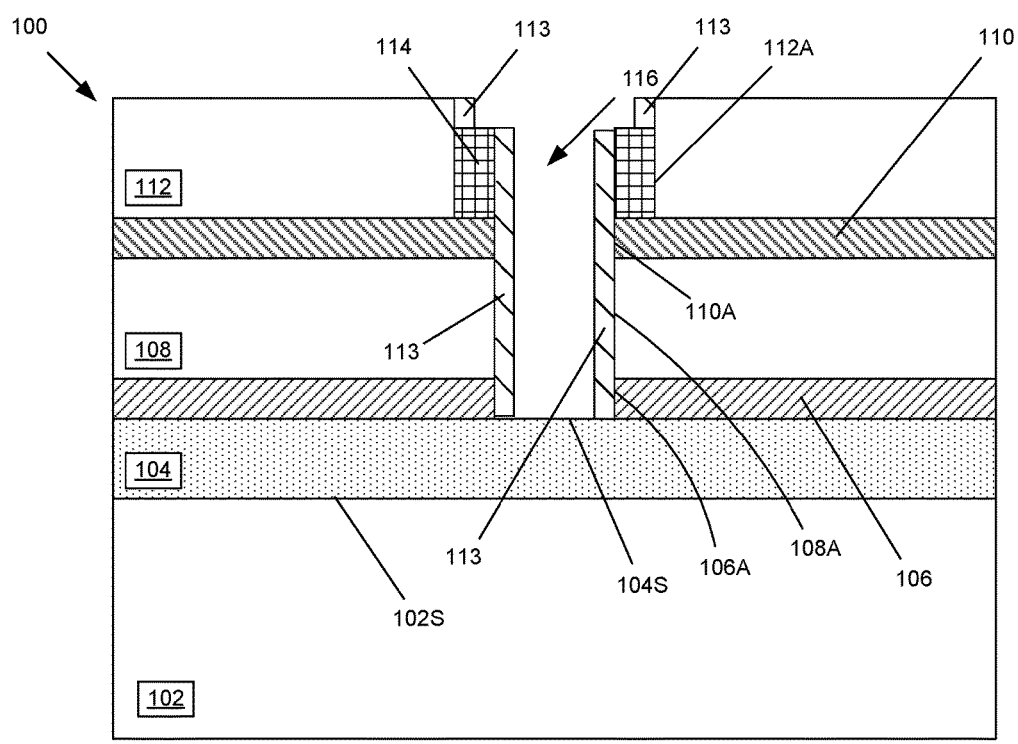

FIG. 10 depicts an alternative process flow wherein, after the formation of the internal spacer 114 and the formation of the cavity 116, an internal spacer 113 is formed in the cavity 116. The internal spacer 113 may be comprised of a material such as, for example, silicon dioxide. In one illustrative example, the internal spacer 113 was formed in the cavity 116 by performing a conformal deposition process to form a layer of spacer material and thereafter performing an anisotropic etching process. The spacer 113 may be formed to any desired thickness. At this point, the vertically oriented channel semiconductor structure 118 may be formed in the cavity 116 adjacent the spacer 113 as described above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a vertical transistor device, the method comprising:
    forming a plurality of layers of material above a bottom source/drain (S/D) layer of semiconductor material that is positioned above a semiconductor substrate, said plurality of layers including a bottom spacer layer of dielectric material positioned on said bottom source/drain (S/D) layer of semiconductor material, a sacrificial gate material layer positioned on said bottom spacer layer of dielectric material, a top spacer layer of dielectric material positioned on said sacrificial gate material layer, and a sacrificial layer of material positioned on said top spacer layer of material;
    performing at least one etching process to define a cavity in said plurality of layers of material, wherein a portion of said bottom source/drain (S/D) layer of semiconductor material is exposed at a bottom of said cavity;
    performing at least one epi deposition process to form a vertically oriented channel semiconductor structure on said bottom source/drain (S/D) layer of semiconductor material and in said cavity and a top source/drain (S/D) layer of semiconductor material above said vertically oriented channel semiconductor structure;
    after performing said at least one epi deposition process, removing at least one of said plurality of layers of material to thereby expose an outer perimeter surface of said vertically oriented channel semiconductor structure; and forming a gate structure around said exposed outer perimeter surface of said vertically oriented channel semiconductor structure.

2. The method of claim 1, wherein performing said at least one epi deposition process comprises performing a first epi deposition process to form said vertically oriented channel semiconductor structure and performing a second epi deposition process to form said top source/drain (S/D) layer of semiconductor material on an upper surface of said vertically oriented channel semiconductor structure.

3. The method of claim 2, wherein, prior to removing at least one of said plurality of layers of material to thereby expose said outer perimeter surface of said vertically oriented channel semiconductor structure, the method further comprises forming a cap layer above said top source/drain (S/D) layer of semiconductor material.

4. The method of claim 1, wherein performing said at least one etching process to define said cavity comprises performing at least one etching process to remove a portion of said sacrificial layer of material, said top spacer layer of dielectric material, said sacrificial gate material layer and said bottom spacer layer of dielectric material, wherein removal of said portion of said bottom spacer layer of dielectric material exposes a portion of said bottom source/drain (S/D) layer of semiconductor material.

5. The method of claim 4, wherein removing said at least one of said plurality of layers of material to thereby expose an outer perimeter surface of said vertically oriented channel semiconductor structure comprises performing an etching process to remove said sacrificial gate material layer while leaving a portion of said top spacer layer of dielectric material in place adjacent an upper portion of said vertically oriented channel semiconductor structure and a portion of said bottom spacer layer of dielectric material in place adjacent a lower portion of said vertically oriented channel semiconductor structure.

6. The method of claim 4, wherein performing said at least one etching process to define said cavity comprises performing a first etching process to define a first opening in said sacrificial layer of material that exposes a portion of said top spacer layer of dielectric material and wherein the method further comprises forming an internal spacer within said first opening, wherein said cavity is substantially self-aligned to said internal spacer.

7. The method of claim 1, wherein said bottom source/drain (S/D) layer of semiconductor material is formed on an upper surface of said semiconductor substrate by performing a second epi deposition process.

8. The method of claim 1, wherein said vertically oriented channel semiconductor structure and said substrate comprise different semiconductor material, said gate structure comprises a high-k gate insulation layer and at least one layer comprising a metal, said bottom spacer layer of dielectric material and said top spacer layer of dielectric material comprise SiCBN, and said sacrificial gate material layer comprises one of silicon dioxide or an oxidizable material.

9. The method of claim 1, wherein, after performing said at least one etching process to define said cavity in said plurality of layers of material and prior to performing said first epi deposition process the method further comprises:
performing an oxidation process to oxide regions within said cavity on the surface of at least one of said plurality of layers of material and on said exposed portion of said bottom source/drain (S/D) layer of semiconductor material at said bottom of said cavity; and performing an oxide etching process to remove said oxide region from said bottom source/drain (S/D) layer of semiconductor material within said cavity while leaving a portion of said oxide region within said cavity on the surface of said at least one of said plurality of layers of material.

10. The method of claim 1, wherein, after performing said at least one etching process to define said cavity in said plurality of layers of material and prior to performing said first epi deposition process, the method further comprises forming an internal spacer within said cavity by performing a conformal deposition process to deposit a layer of spacer material within said cavity and thereafter performing an anisotropic etching process on said layer of spacer material so as to thereby define said internal spacer, wherein, at the completion of said anisotropic etching process, a portion of said bottom source/drain (S/D) layer of semiconductor material is exposed at said bottom of said cavity.

11. A method of forming a vertical transistor device, the method comprising:
performing a first epi deposition process to form a bottom source/drain (S/D) layer of semiconductor material above a semiconductor substrate;
forming a plurality of layers of material above said bottom source/drain (S/D) layer of semiconductor material, said plurality of layers including a bottom spacer layer of dielectric material positioned on said bottom source/drain (S/D) layer of semiconductor material, a sacrificial gate material layer positioned on said bottom spacer layer of dielectric material, a top spacer layer of dielectric material positioned on said sacrificial gate material layer, and a sacrificial layer of material positioned on said top spacer layer of material;
performing at least one etching process to define a cavity in said plurality of layers of material, wherein a portion of said bottom source/drain (S/D) layer of semiconductor material is exposed at a bottom of said cavity;
performing at least one second epi deposition process to form a vertically oriented channel semiconductor structure on said bottom source/drain (S/D) layer of semiconductor material and in said cavity and to form a top source/drain (S/D) layer of semiconductor material above said vertically oriented channel semiconductor structure;
after performing said at least one epi deposition process, removing at least said sacrificial gate material layer to thereby expose an outer perimeter surface of said vertically oriented channel semiconductor structure; and
forming a gate structure around said exposed outer perimeter surface of said vertically oriented channel semiconductor structure.

12. The method of claim 11, wherein, prior to removing said at least said sacrificial gate material layer to thereby expose said outer perimeter surface of said vertically oriented channel semiconductor structure, the method further comprises forming a cap layer above said top source/drain (S/D) layer of semiconductor material.

13. The method of claim 11, wherein performing said at least one etching process to define said cavity comprises performing said at least one etching process to remove a portion of said sacrificial layer of material, said top spacer layer of dielectric material, said sacrificial gate material layer and said bottom spacer layer of dielectric material, wherein removal of said portion of said bottom spacer layer of dielectric material exposes a portion of said bottom source/drain (S/D) layer of semiconductor material.

14. The method of claim 11, wherein removing said at least said sacrificial gate material layer comprises:
- performing a first etching process to remove said sacrificial layer of material while using said top spacer layer of dielectric material as an etch stop;
- performing a second etching process to remove a portion of said top layer of spacer material while using said sacrificial gate material layer as an etch stop layer, wherein, at the completion of said second etching process, a portion of said top spacer layer of dielectric material remains in place adjacent an upper portion of said vertically oriented channel semiconductor structure; and
- performing a third etching process to remove said sacrificial layer of material so as to thereby expose said outer perimeter surface of said vertically oriented channel semiconductor structure, wherein said bottom layer of spacer dielectric material is used as an etch stop layer during said third etching process.

15. A vertical transistor device, comprising:
- a bottom source/drain (S/D) structure positioned above a semiconductor substrate;
- a vertically oriented channel semiconductor structure positioned on said bottom source/drain (S/D) structure;
- a bottom spacer positioned on said bottom source/drain (S/D) structure around a first vertical portion of said vertically oriented channel semiconductor structure;
- a gate structure having a first horizontal top surface positioned above said bottom spacer and around a second vertical portion of said vertically oriented channel semiconductor structure;
- a top spacer positioned on said first horizontal top surface of said gate structure around a third vertical portion of said vertically oriented channel semiconductor structure;
- a top source/drain (S/D) structure positioned on said vertically oriented channel semiconductor structure, said top source/drain (SD) structure having a second horizontal top surface;
- a sidewall spacer positioned on a sidewall of said top source/drain (S/D) structure and on a first portion of said second horizontal top surface of said top spacer, wherein said sidewall spacer and said top spacer considered collectively define an L-shaped spacer; and
- a cap layer positioned above said sidewall spacer and above said top source/drain (S/D) structure.

16. The device of claim 15, wherein said sidewall spacer and said top spacer comprise different materials.

17. The device of claim 15, wherein said top source/drain structure (S/D) has a greater lateral width than a lateral width of said vertically oriented channel semiconductor structure and wherein a portion of said top source/drain structure (S/D) is positioned on a second portion of said second horizontal top surface of said top spacer.

* * * * *